United States Patent
Ko et al.

(10) Patent No.: US 7,348,607 B2
(45) Date of Patent: Mar. 25, 2008

(54) PLANAR AVALANCHE PHOTODIODE

(75) Inventors: Cheng C. Ko, Ann Arbor, MI (US); Barry Levine, Livingston, NJ (US)

(73) Assignee: Picometrix, LLC, Ann Arbor, MI (US)

( * ) Notice: Subject to any disclaimer, the term of this patent is extended or adjusted under 35 U.S.C. 154(b) by 151 days.

(21) Appl. No.: 10/502,110

(22) PCT Filed: Feb. 3, 2003

(86) PCT No.: PCT/US03/03323

§ 371 (c)(1),
(2), (4) Date: Mar. 11, 2005

(87) PCT Pub. No.: WO03/065418

PCT Pub. Date: Aug. 7, 2003

(65) Prior Publication Data

US 2005/0156192 A1    Jul. 21, 2005

Related U.S. Application Data

(60) Provisional application No. 60/353,530, filed on Feb. 1, 2002, provisional application No. 60/353,765, filed on Feb. 1, 2002.

(51) Int. Cl.
*H01L 29/732* (2006.01)

(52) U.S. Cl. .................. 257/185; 257/186; 257/191; 257/438; 257/E31.063

(58) Field of Classification Search ............. 257/183, 257/185, 186, 190, 191, 438, 452, E31.116, 257/E31.063
See application file for complete search history.

(56) References Cited

U.S. PATENT DOCUMENTS

| 4,236,069 | A | 11/1980 | Laughlin |
| 4,597,004 | A | 6/1986 | Longeway et al. |
| 4,686,550 | A | 8/1987 | Capasso et al. |
| 4,840,916 | A * | 6/1989 | Yasuda et al. ............. 438/91 |

(Continued)

FOREIGN PATENT DOCUMENTS

| JP | 9-199753 | | 7/1997 |
| JP | 09199753 | A * | 7/1997 |
| WO | WO 03/065416 | | 8/2003 |
| WO | WO 03/065417 | | 8/2003 |
| WO | WO 03/065418 | | 8/2003 |

OTHER PUBLICATIONS

M.A. Itzler, C.S. Wang, S. McCoy, N. Codd and N. Komba, Planar bulk InP avalanche photodiode design for 2.5 and 10Gb/s applications, Proc 24th ECOC 1998, paper MoB03.

L.E. Tarof, J. Yu, R. Bruce, D.G. Knight, T. Baird and B. Oosterbrink, High frequency performance of separate absorption grading charge and multiplication InP/InGaAs avalanche photodiodes, IEEE Photon. Technol. Lett. 5, 672-674, 1993.

(Continued)

*Primary Examiner*—Minh-Loan T Tran
(74) *Attorney, Agent, or Firm*—Brinks Hofer Gilson & Lione

(57) ABSTRACT

The present invention includes a planar avalanche photodiode having a first n-type semiconductor layer defining a planar contact area, and a second n-type semiconductor layer having a p-type diffusion region. Further features of the structure includes an n-type semiconductor multiplication layer, an n-type semiconductor absorption layer, and a p-type contact layer. Further embodiments include a planar avalanche photodiode having a first n-type semiconductor layer defining a planar contact area, an n-type semiconductor multiplication layer, an n-type semiconductor absorption layer and a p-type semiconductor layer electrically coupled to a p-type contact layer.

15 Claims, 2 Drawing Sheets

U.S. PATENT DOCUMENTS

| | | |
|---|---|---|
| 5,126,281 A | 6/1992 | Carey et al. |
| 5,146,296 A | 9/1992 | Huth |
| 5,179,430 A | 1/1993 | Torikai |
| 5,365,077 A | 11/1994 | Metzger |
| 5,539,221 A | 7/1996 | Tsuji et al. |
| 5,552,629 A * | 9/1996 | Watanabe .................. 257/438 |
| 5,654,578 A | 8/1997 | Watanabe |
| 5,818,096 A | 10/1998 | Ishibashi et al. |
| 6,081,019 A | 6/2000 | White |
| 6,104,047 A | 8/2000 | Watanabe |
| 6,107,652 A | 8/2000 | Scavennec et al. |
| 6,229,161 B1 | 5/2001 | Nemati et al. |
| 6,229,162 B1 | 5/2001 | Watanabe |
| 6,326,650 B1 | 12/2001 | Allam |
| 6,359,322 B1 | 3/2002 | Haralson et al. |
| 6,548,878 B1 | 4/2003 | Nauleau et al. |
| 6,635,908 B2 | 10/2003 | Tanaka et al. |
| 6,794,631 B2 | 9/2004 | Clark |
| 2002/0070384 A1 | 6/2002 | Clark et al. |
| 2003/0021322 A1 | 1/2003 | Steinle et al. |

OTHER PUBLICATIONS

Watanabe, T. Nakata, M. Tsuji, K. Makita, K. Taguchi, High reliability and low dark current 10 Gb/s planar superlattice avalanche photodiodes, IEEE Photon. Technol. Lett. 9, 1619-1621, 1997.

J.C. Campbell, S. Demiquel, F. Ma, A. Beck, X. Guo, S. Wang, X. Zeng, X. Li, J.D. Beck, M.A. Kinch, A. Huntington, L.A. Coldren, J. Decobert, N. Tscherptner, Recent advances in avalanche photodiodes, IEEE J. Select. Topics Quantum Electron., 10, 777-787, 2004.

R.R. Sutherland, C.P. Skrimshire, M.J. Robertson, A reliability methodology applied to very high reliability planar InGaAs/InP PIN photodetectors, Br. Telecom. Technol. J., 7, 69-77, Jan. 1989.

Watanabe et al., IEEE Photonics Tehncology Letter 8, pp. 827-829, 1996.

* cited by examiner

Incident Light

PLANAR AVALANCHE PHOTODIODE

CROSS-REFERENCE TO RELATED APPLICATIONS

This application is a filing under 35 U.S.C. 371, which claims priority to International Application Ser. No. PCT/US03/03323 filed Feb. 3, 2003, which claims the benefit of U.S. Provisional Application No. 60/353,530, filed Feb. 1, 2002 and U.S. Provisional Application No. 60/353,765, filed Feb. 1, 2002.

FIELD OF INVENTION

The present invention relates to an avalanche photodiode, and in particular to a mesa structure avalanche photodiode having a planar p-n junction.

BACKGROUND AND SUMMARY OF THE INVENTION

Owing to the known interaction between photons and electrons, great advances have been made in the field of photodetectors in recent years, particularly in those photodetectors that utilize semiconductor materials. One type of semiconductor-based photodetector is termed an avalanche photodiode. This type of structure is generally composed of a number of solid semiconductive materials that serve different purposes such as absorption and multiplication.

The avalanche photodiode structure provides the primary benefit of large gain through the action of excited charge carriers that produce large numbers of electron-hole pairs in the multiplication layer. However, an avalanche photodiode is so efficient at producing large numbers of charge carriers that it runs the risk of becoming saturated, thus adversely affecting the bandwidth of the device. In order to prevent charge carrier breakdown, it is imperative that the electric field be regulated within the avalanche photodiode itself, and in particular it is desirable to have the electric field in the multiplication layer be significantly higher than that in the absorption layer.

Mesa avalanche photodiodes have exposed high field p-n junction that are difficult to passivate using a layer of insulating material. Therefore, standard commercial InP/InGaAs avalanche photodiodes use planar diffused structures which bury the p-n junction, leading to robust, long lifetime devices. However, these InP avalanche photodiodes require extremely accurate diffusion control of both the depth and the doping density of the p-type semiconductor regions. This critical control is essential, since this diffusion controls the magnitude of the electric field in the multiplication region, the length of the avalanche region, as well as the charge control.

There are no truly planar InAlAs avalanche photodiodes that have been proposed. An existing avalanche photodiode has an etched isolation ring which is etched down to expose the top of the high field avalanche region followed by a deep titanium implant to further isolate the high field region. This is then followed by a zinc diffusion to contact the p-type semiconductor region. This is a very complicated structure requiring critical etching and implant steps. In spite of these efforts, it is believed that the lifetime of this avalanche photodiode is ten times shorter than their standard planar avalanche photodiode and thus not sufficient for telecommunications use.

Therefore, there is a need in the art for a simple yet effective avalanche photodiode that is capable of being produced cheaply and with efficient critical control. Accordingly, the present invention comprises a planar avalanche photodiode including a first n-type semiconductor layer defining a planar contact area, and a second n-type semiconductor layer having a p-type diffusion region. Further features of the structure include an n-type semiconductor multiplication layer and an n-type semiconductor absorption layer, and a p-type contact layer. The p-type diffusion region is disposed directly adjacent to the p-type contact layer, thereby decreasing the capacitance of the planar avalanche photodiode while increasing the speed, lifetime, and cost-effectiveness of the structure. Further embodiments and advantages of the present invention are discussed below with reference to the figures.

DETAILED DESCRIPTION OF THE PREFERRED EMBODIMENT

In accordance with a preferred embodiment of the present invention, an epitaxial structure is provided for photoconductive purposes. The photoconductive structure is an avalanche photodiode that is optimized for increased performance through diffused p-type doping at a p-n junction. The particulars of the structure and method of manufacture of the present invention are discussed further herein.

Figure 1:
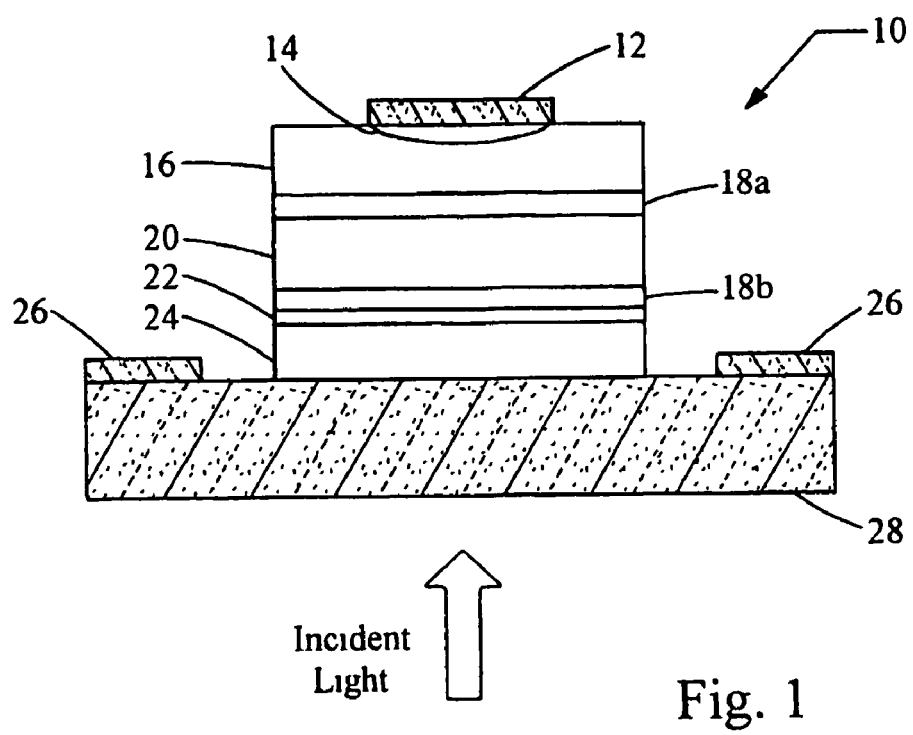
FIG. 1 is a cross-sectional view of a planar avalanche photodiode in accordance with a first embodiment of the present invention.

Referring to FIG. 1, a cross-sectional view of a planar avalanche photodiode 10 is shown in accordance with a first embodiment of the present invention. The planar avalanche photodiode 10 includes a p-type contact layer 12 and a first n-type semiconductor layer 28 providing a planar contact area. The p-type contact layer 12 is disposed on a second n-type semiconductor layer 16, which includes a p-type diffusion region 14 for regulating the electric field at the p-n junction formed by the p-type contact layer 12 and the second n-type semiconductor layer 16.

The planar avalanche photodiode 10 further includes an n-type semiconductor absorption layer 20 that is separated from the second n-type semiconductor layer by a first grading layer 18a. The n-type absorption layer 20 is disposed on an n-type semiconductor multiplication layer 24. In a preferred embodiment, the n-type semiconductor absorption layer 20 is separated from the n-type multiplication layer 24 by a p-type semiconductor charge control layer 22 and, preferably, a second grading layer 18b. A pair of n-type contact layers 26 is for collecting electrons is shown disposed on the first n-type semiconductor layer 28.

The first n-type semiconductor layer 28 is selected from a group comprising tertiary semiconductors, or group III-V semiconductors. Accordingly, the first n-type semiconductor layer 28 is either two elements from group III combined with one element from group V or the converse, two elements from group V combined with one element from group III. A table of representative groups of the periodic table is shown below.

| GROUP II | GROUP III | GROUP IV | GROUP V |
| --- | --- | --- | --- |
| Zinc (Zn) | Aluminum (Al) | Silicon (Si) | Phosphorus (P) |
| Cadmium (Cd) | Gallium (Ga) | Germanium (Ge) | Arsenic (As) |
| Mercury (Hg) | Indium (In) | | Antimony (Sb) |

In the preferred embodiment, the first n-type semiconductor layer 28 is InAlAs. However, it is understood that the first n-type semiconductor layer 28 may be any tertiary semiconductor that provides the necessary bandgap for optimized operation of the planar avalanche photodiode 10.

The n-type semiconductor multiplication layer 24 is also selected from a group comprising tertiary semiconductors, or group III-V semiconductors. In the preferred embodiment, the n-type semiconductor multiplication layer 24 is InAlAs. Preferably, the n-type semiconductor absorption layer 20 is also selected from a group comprising tertiary semiconductors, or group III-V semiconductors. In the preferred embodiment, the n-type semiconductor absorption layer 20 is InGaAs. However, it is understood that both the n-type semiconductor absorption layer 20 and the n-type semiconductor multiplication layer 24 may be any tertiary semiconductor that provides the necessary bandgap for optimized operation of the planar avalanche photodiode 10.

The second n-type semiconductor layer 16 is also selected from a group comprising tertiary semiconductors, or group III-V semiconductors. As before, the second n-type semiconductor layer 16 is either two elements from group III combined with one element from group V or the converse, two elements from group V combined with one element from group III. In the preferred embodiment, the second n-type semiconductor layer 16 is InAlAs. However, it is understood that the second n-type semiconductor layer 18 may be any tertiary semiconductor that provides the necessary bandgap for optimized operation of the planar avalanche photodiode 10.

As noted, the second n-type semiconductor layer 16 defines in part a p-type diffusion region 14 near the junction between the former and the p-type contact area 12. The p-type diffusion region 14 lowers the capacitance of the planar avalanche photodiode 10 at the aforementioned p-n junction, thereby increasing the overall speed of the structure.

An aspect of the planar avalanche photodiode 10 is that all the critical layer thicknesses and doping concentrations are regulated in the initial crystal growth, and thus are under excellent control, can be reproducibly grown and are uniform over the entire wafer. Accordingly, difficulties associated with process control during fabrication, particularly those related the diffusion step, are not manifest in the present invention.

Figure 2:
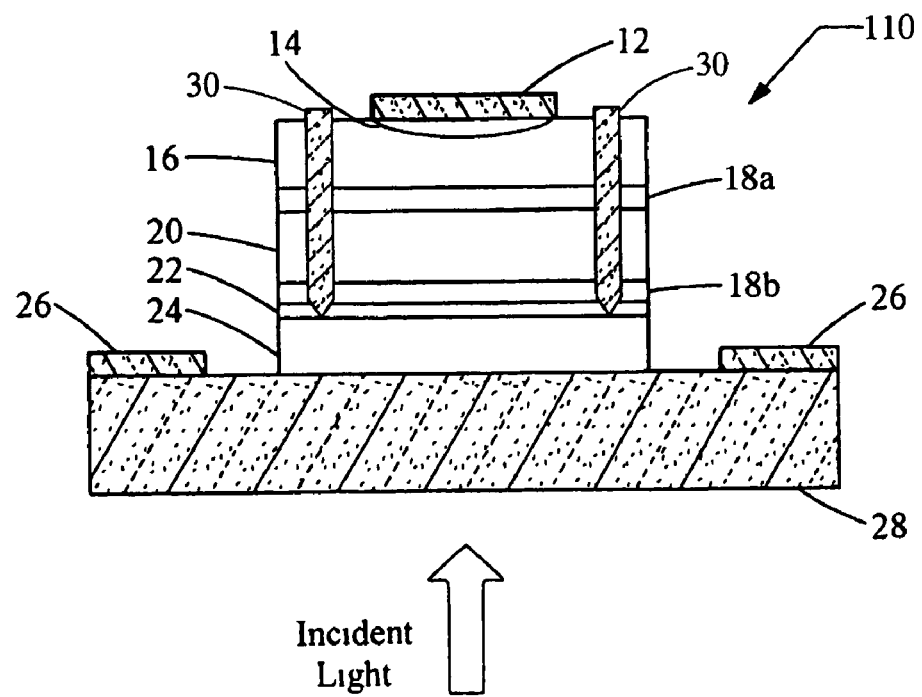
FIG. 2 is a cross-sectional view of a planar avalanche photodiode in accordance with an alternate embodiment of the present invention.

In another aspect of the present invention, shown in FIG. 2, the planar avalanche photodiode 110 includes a field control structure 30, such as an n-type implant or deep donor. The field control structure 30 is shown schematically as a pair of intrusions into the planar avalanche photodiode 110. However, in practical application, the field control structure 30 would consist of a region of the planar avalanche photodiode 110 that has undergone an implantation process, as discussed further herein.

As in the first embodiment the invention, the planar avalanche photodiode 110 includes the p-type contact layer 12 and the first n-type semiconductor layer 28 providing a planar contact area. The p-type contact layer 12 is disposed on the second n-type semiconductor layer 16, which includes the p-type diffusion region 14 for regulating the electric field at the p-n junction formed by the p-type contact layer 12 and the second n-type semiconductor layer 16. The field control structure 30 provides additional electric field reduction around the aforementioned p-n junction.

The field control structure 30 preferably takes the form of an implanted n-type semiconductor or ion. For example, the field control structure 30 may take the form of a region having Si infused into the planar avalanche photodiode 110. Alternatively, a deep donor such as hydrogen or helium could be implanted in the region indicated by the field control structure 30. The effects of the field control structure 30 could also be realized through hydrogen passivation in the region of import. The field control structure 30 in its various forms will not penetrate the n-type semiconductor multiplication layer 24, as it is desirable to maintain a high electric field in this region.

Figure 3:
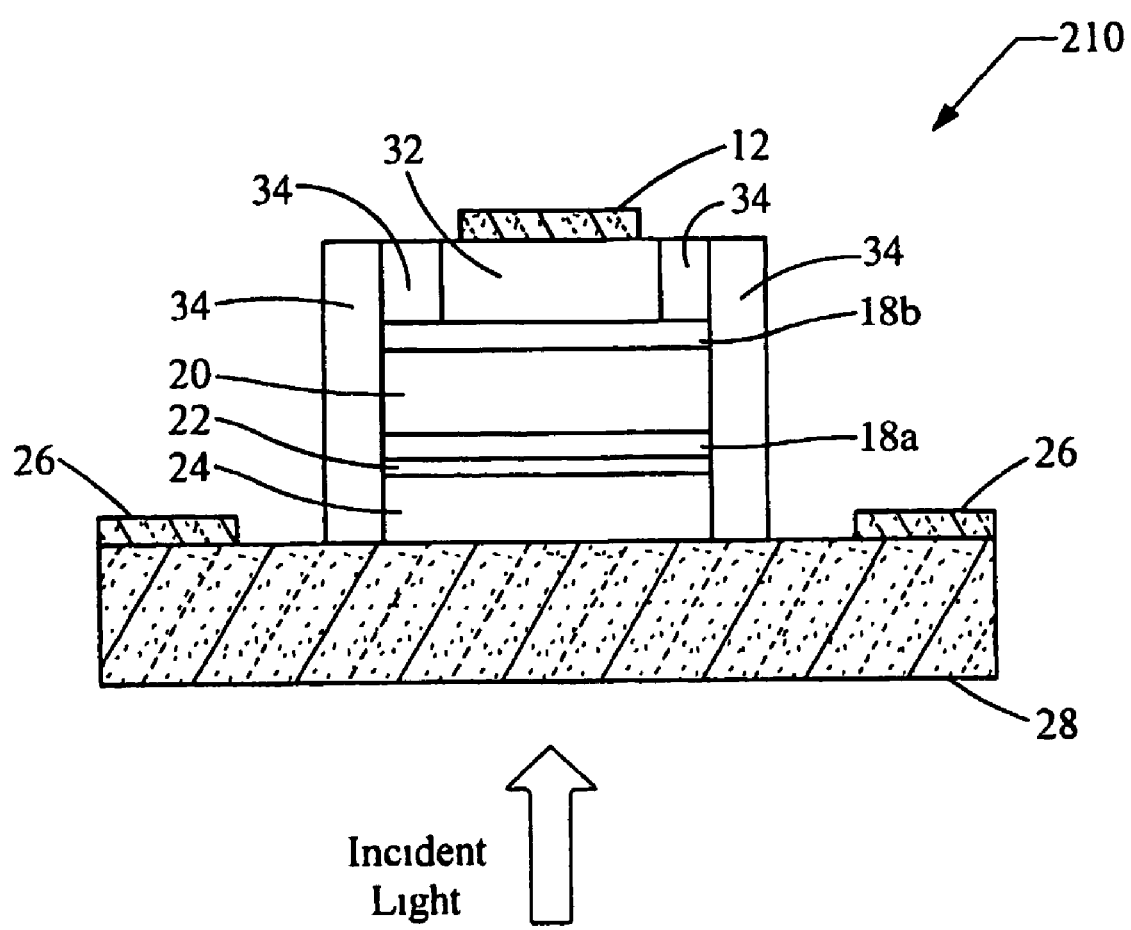
FIG. 3 is a cross-sectional view of a mini-mesa planar avalanche photodiode in accordance with an alternate embodiment of the present invention.

In an alternate embodiment, shown in FIG. 3, the planar avalanche photodiode 210 includes a mini-mesa structure. As such, the second n-type semiconductor layer described above is replaced with a p-type semiconductor layer 32 that is epitaxially grown. Preferably, the p-type semiconductor layer 32 is InAlAs, but it is understood that the p-type semiconductor layer 32 may be any type III-V semiconductor that provides a suitable bandgap for optimized performance.

As in the prior embodiments, the planar avalanche photodiode 210 also includes the p-type contact layer 12 and the first n-type semiconductor layer 28 providing a planar contact area. The p-type contact layer 12 is disposed on the p-type semiconductor layer 32. Passivated regions 34 are disposed in a symmetrical fashion about the p-type semiconductor layer 32 and the remaining structure of the planar avalanche photodiode.

In the embodiment shown in FIG. 3 the full structure is grown initially including the p-type semiconductor layer 32, and then it is etched down to the first n-type semiconductor absorption layer 20. The foregoing process defines a localized p- contact region which controls the relevant capacitance area, thus resulting in a low capacitance and a high speed avalanche photodiode. Moreover, the entire planar avalanche photodiode 32 is epitaxially grown and does not require any p-type diffusion.

A particularly advantageous approach to form the passivated region 34 is to utilize wet oxidation. The p-type semiconductor layer 32 can be oxidized through to one of the n-type semiconductor absorption layer 20 or the first grading layer 18a. Similarly, the sides of the outer mesa, which includes the n-type semiconductor multiplication layer 24, the p-type semiconductor charge control layer 22, and the second grading layer 18b, can be oxidized as indicated in FIG. 3. Finally, it is possible to oxidize the first n-type semiconductor layer 28 so that there is a gradual interface between the unoxidized and oxidized layers. This will reduce the field at the interface between the first n-type semiconductor layer 28 and the n-type semiconductor multiplication layer 24 leading to better passivation.

The passivation approach may be combined with proton or oxygen implantation to additionally control the p-type semiconductor charge control layer 22 and reduce the field at the edge of the outer mesa to further improve passivation. A suitable passivation technique includes the use of a surface passivation material such as BCB (benzocyclobutene). Alternatively, other surface passivation materials such as silicon dioxide, silicon nitride, or polyimide could be used to passivate the outside of the planar avalanche photodiode 210.

As described, the present invention provides numerous advantages over existing avalanche photodiodes. Notably, the structure of the present invention is truly planar. Moreover, the structure of the planar avalanche photodiode 10 shown in FIG. 1 is reversed from a typical InP/InGaAs avalanche photodiode geometry since electrons are being avalanched in the n-type semiconductor multiplication layer 24 as opposed to the avalanching of holes in an InP multiplication region, as found in previous avalanche photodiodes. This structural inversion allows the low field region in the InGaAs absorption region to be at the top of the device rather than the high field avalanche region as in a standard InP avalanche photodiode.

It should be apparent to those skilled in the art that the above-described embodiments are merely illustrative of but a few of the many possible specific embodiments of the present invention. Numerous and various other arrangements can be readily devised by those skilled in the art without departing from the spirit and scope of the invention as defined in the following claims.

The invention claimed is:

1. A planar avalanche photodiode comprising:
an n-type semiconductor layer defining a contact area;
a semiconductor layer having a p-type diffusion region, the p-type diffusion region having a smaller area than the semiconductor layer;
a semiconductor multiplication layer;
a semiconductor absorption layer;
a p-type contact layer;
wherein the p-type diffusion region is disposed directly adjacent to the p-type contact layer and the semiconductor absorption layer is disposed between the semiconductor multiplication layer and the semiconductor layer with the p-type diffusion region; and
at least one grading layer disposed adjacent to the semiconductor absorption layer.

2. The planar avalanche photodiode of claim 1 further comprising a p-type semiconductor charge control layer disposed adjacent to the semiconductor multiplication layer.

3. The planar avalanche photodiode of claim 1 a further comprising at least one n-type contact layer.

4. The planar avalanche photodiode of claim 1 wherein the n-type semiconductor layer is InAlAs.

5. The planar avalanche photodiode of claim 1 wherein the semiconductor layer with the p-type diffusion layer is InAlAs.

6. The planar avalanche photodiode of claim 1 wherein the semiconductor multiplication layer is InAlAs.

7. The planar avalanche photodiode of claim 1 wherein the semiconductor absorption layer is InGaAs.

8. A planar avalanche photodiode comprising:
an n-type semiconductor layer defining a contact area;
a semiconductor multiplication layer;
a semiconductor absorption layer, the semiconductor multiplication layer being disposed between the first n-type semiconductor layer and the semiconductor absorption layer;
a p-type semiconductor contact layer having a smaller area than the absorption layer, the semiconductor absorption layer being disposed between the semiconductor multiplication layer and the p-type semiconductor contact layer;
wherein the photodiode has a low field region near the p-type semiconductor contact layer and a low capacitance at least one grading layer disposed adjacent to the semiconductor absorption layer; and
at least one grading layer disposed adjacent to the semiconductor absorption layer.

9. The planar avalanche photodiode of claim 8 further comprising a p-type semiconductor charge control layer disposed adjacent to the semiconductor multiplication layer.

10. The planar avalanche photodiode of claim 8 wherein the n-type semiconductor layer is InAlAs.

11. The planar avalanche photodiode of claim 8 wherein the semiconductor multiplication layer is InAlAs.

12. The planar avalanche photodiode of claim 8 wherein the semiconductor absorption layer is InGaAs.

13. The planar avalanche photodiode of claim 8 wherein the p-type semiconductor contact layer is InAlAs.

14. A planar avalanche photodiode further comprising:
an n-type semiconductor layer defining a contact area;
a semiconductor multiplication layer;
a semiconductor absorption layer, the semiconductor multiplication layer being disposed between the first n-type semiconductor layer and the semiconductor absorption layer;
a p-type semiconductor contact layer having a smaller area than the absorption layer, the semiconductor absorption layer being disposed between the semiconductor multiplication layer and the p-type semiconductor contact layer;
wherein the photodiode has a low field region near the p-type semiconductor contact layer and a low capacitance at least one grading layer disposed adjacent to the semiconductor absorption layer; and
a passivated region including a semiconductor layer disposed between the p-type contact layer and the semiconductor absorption layer.

15. The planar avalanche photodiode of claim 14 wherein the passivated region includes a portion of a first grading layer and a portion of the semiconductor absorption and multiplication layers.

* * * * *

UNITED STATES PATENT AND TRADEMARK OFFICE
CERTIFICATE OF CORRECTION

PATENT NO. : 7,348,607 B2  
APPLICATION NO. : 10/502110  
DATED : March 25, 2008  
INVENTOR(S) : Cheng C. Ko and Barry Levine Page 1 of 1

It is certified that error appears in the above-identified patent and that said Letters Patent is hereby corrected as shown below:

In Claim 3, column 5, line 45, after "1", delete "a".

Signed and Sealed this

Twenty-ninth Day of July, 2008

JON W. DUDAS  
*Director of the United States Patent and Trademark Office*